United States Patent
Case et al.

(10) Patent No.: US 8,418,119 B2
(45) Date of Patent: Apr. 9, 2013

(54) LOGICAL CIRCUIT NETLIST REDUCTION AND MODEL SIMPLIFICATION USING SIMULATION RESULTS CONTAINING SYMBOLIC VALUES

(75) Inventors: Michael L. Case, Pflugerville, TX (US); Jason R. Baumgartner, Austin, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/104,573

(22) Filed: May 10, 2011

(65) Prior Publication Data
US 2012/0290992 A1 Nov. 15, 2012

(51) Int. Cl.
*G06F 9/455* (2006.01)
(52) U.S. Cl. .......................... 716/132; 716/104; 716/136
(58) Field of Classification Search .................. 716/103, 716/104, 136, 132
See application file for complete search history.

(56) References Cited

U.S. PATENT DOCUMENTS

| 5,537,580 A | 7/1996 | Giomi et al. |
|---|---|---|
| 5,752,000 A | 5/1998 | McGreer et al. |
| 5,774,370 A | 6/1998 | Giomi et al. |
| 6,077,305 A | 6/2000 | Cheng et al. |
| 6,370,495 B1 | 4/2002 | Weddle et al. |
| 6,698,001 B2 | 2/2004 | Bae |
| 6,836,877 B1 | 12/2004 | Dupenloup |
| 6,931,611 B2 | 8/2005 | Martin et al. |
| 7,310,790 B2 | 12/2007 | Melham et al. |
| 7,380,222 B2 | 5/2008 | Baumgartner et al. |
| 7,428,712 B1 | 9/2008 | Singh et al. |
| 7,464,015 B2 | 12/2008 | Iwashita |
| 7,475,370 B2 | 1/2009 | Baumgartner et al. |

(Continued)

OTHER PUBLICATIONS

Case, et al., "Enhanced Verification by Temporal Decomposition", Formal Methods in Computer-Aided Design (FMCAD) Conference, Nov. 2009, Austin TX.

(Continued)

*Primary Examiner* — Vuthe Siek
*Assistant Examiner* — Mohammed Alam
(74) *Attorney, Agent, or Firm* — Mitch Harris, Atty at Law, LLC; Andrew M. Harris; Matthew W. Baca

(57) ABSTRACT

A logic synthesis program, method and system for simplifying and/or reducing a logic design receives output from a logic simulator that uses symbolic values for stimulus and contains symbolic values in the logic simulator output. Relationships between the nodes dependent on symbolic values can be used to merge nodes or otherwise simplify the logic design. Behaviors such as oscillators, transient values, identical signals, dependent logical states and chicken-switch determined states that depend on the symbolic values can be detected in the simulation results and the netlist simplified using the results of the detection. The netlist can be simplified by inserting registers to represent nodes that assume a symbolic value or combination based on symbolic values either statically or after an initial transient. Oscillating nodes can be replaced with equivalent oscillator circuits, and nodes having values dependent on chicken-switch operation can be detected and replaced with registers initialized from the chicken-switch input states.

21 Claims, 5 Drawing Sheets

U.S. PATENT DOCUMENTS

| | | | |
|---|---|---|---|
| 2006/0248483 A1* | 11/2006 | Baumgartner et al. | 716/2 |
| 2007/0179639 A1* | 8/2007 | Sakai | 700/29 |
| 2008/0109769 A1* | 5/2008 | Baumgartner et al. | 716/3 |
| 2008/0235637 A1* | 9/2008 | Baumgartner et al. | 716/4 |
| 2010/0042965 A1 | 2/2010 | Baumgartner et al. | |
| 2010/0185993 A1 | 7/2010 | Baumgartner et al. | |
| 2010/0251199 A1 | 9/2010 | Baumgartner et al. | |
| 2010/0293513 A1 | 11/2010 | Baumgartner et al. | |
| 2011/0093824 A1 | 4/2011 | Baumgartner et al. | |
| 2011/0093825 A1* | 4/2011 | Baumgartner et al. | 716/108 |

OTHER PUBLICATIONS

Wilson, et al., "Reliable Verification Using Symbolic Simulation with Scalar Values", Design Automation Conference (DAC) Jun. 2000, pp. 124-129, Los Angeles, CA.

Cheng, Adriel, "Symbolic Trajectory Evaluation (STE)", website, page downloaded from http://www.eleceng.adelaide.edu.au/personal/acheng/public/ste/ste.html on Apr. 21, 2011.

Velev, et al., "Efficient Modeling of Memory Arrays in Symbolic Ternary Simulation", TACAS '98 Portugal, Mar. 1998.

* cited by examiner

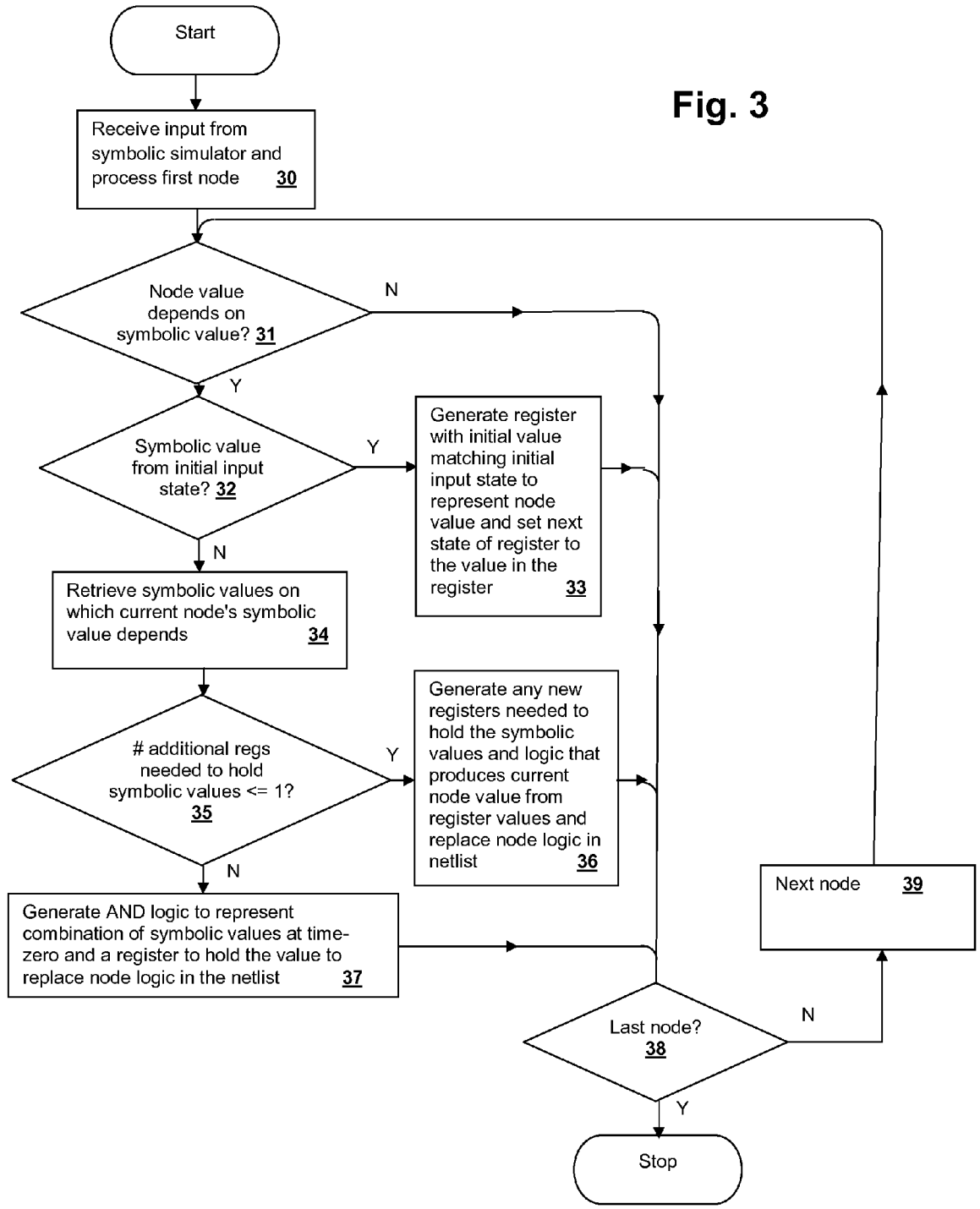

LOGICAL CIRCUIT NETLIST REDUCTION AND MODEL SIMPLIFICATION USING SIMULATION RESULTS CONTAINING SYMBOLIC VALUES

CROSS-REFERENCE TO RELATED APPLICATIONS

The present U.S. Patent Application is related to co-pending U.S. patent application Ser. No. 13/104,478, entitled "REACHABILITY ANALYSIS BY LOGICAL CIRCUIT SIMULATION FOR PROVIDING OUTPUT SETS CONTAINING SYMBOLIC VALUES", filed contemporaneously herewith, the disclosure of which is incorporated herein by reference.

BACKGROUND OF THE INVENTION

1. Field of the Invention

The present invention is related to circuit simulation by over-approximation techniques that reduce simulation burden over that of exhaustive analysis, and more specifically to simulation programs, methods and system that use symbolic states in the results of the simulation to enhance the simulation, perform netlist reduction and other model simplification.

2. Description of Related Art

Logic simulators typically verify designs of processor integrated circuits (ICs), as well as other large-scale logic, by observing certain behaviors during the simulation process and reducing the netlist that describes the logic in various ways using the information gathered during the simulation process.

One part of the simulation performed on such devices is reachability analysis, which in present systems is typically an approximate reachability analysis that, through certain assumptions, reduces the amount of time to approximate very closely the state-space that can be reached by the logic in a device, or a portion of a device being simulated. By using values of initial state including both binary states as well as an unknown state, behavior of the logic can be observed and any logic output that appears to resolve to one of the two known states, or to a pattern oscillating between the two known states, can be simplified. Through this process, the simulation can be trimmed dynamically while in process, leading to an approximate, but generally valid description of the state flow of the logic that is obtained in a far shorter time than would be possible with exhaustive simulation.

However, due to the very large and increasing size of logic designs, even existing techniques are time-consuming and memory intensive. Therefore, it would be desirable to provide a simulation program, method and system that have improved performance and/or reduced memory requirements.

BRIEF SUMMARY OF THE INVENTION

The invention is embodied in a computer-performed method, computer system and computer program product that reduce or simplify logic designs using simulation results that contain symbolic values. The computer system is a computer system executing program instructions for carrying out the method and the computer program product is a program for carrying out the method.

The method receives the results of a simulation that includes symbolic values that represent one or more inputs to the logic and that appear in the simulation results. Relationships between nodes and between nodes and the inputs are observed and used to reduce the netlist and/or simplify the logic design, which may include merging nodes that assume the same symbolic value, or value derived from one or more symbolic values, detecting oscillators and transients having states dependent on one or more symbolic values and detecting chicken switch-dependent nodes.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

FIG. 3 is a flow chart depicting a method in accordance with yet another embodiment of the present invention.

DETAILED DESCRIPTION OF THE INVENTION

The present invention encompasses computer-performed methods and programs for receiving simulation results for digital logic circuits and performing netlist reduction and/or simplification using observations of node dependencies on symbolic values that represent input values applied to the digital logic circuits and combinations of those symbolic values generated by the digital logic circuit. The symbolic values are used, along with the non-symbolic values in the results, to perform netlist reduction, as well as other logic simplification such as oscillator detection and modeling, transient node detection and chicken switch detection. The above-incorporated U.S. Patent Application provides detailed disclosure of a simulation technique that can be used to provide the input to such netlist reduction and logic simplification, but other simulation results, such as results from a Symbolic Trajectory Evaluation (STE) analysis that uses at least some symbolic values to represent inputs and relates the current states to next states through antecedent=>consequent state relationships rather than explicit circuit equations that relate the states as in the techniques disclosed in the above-incorporated U.S. Patent Application.

Figure 1:
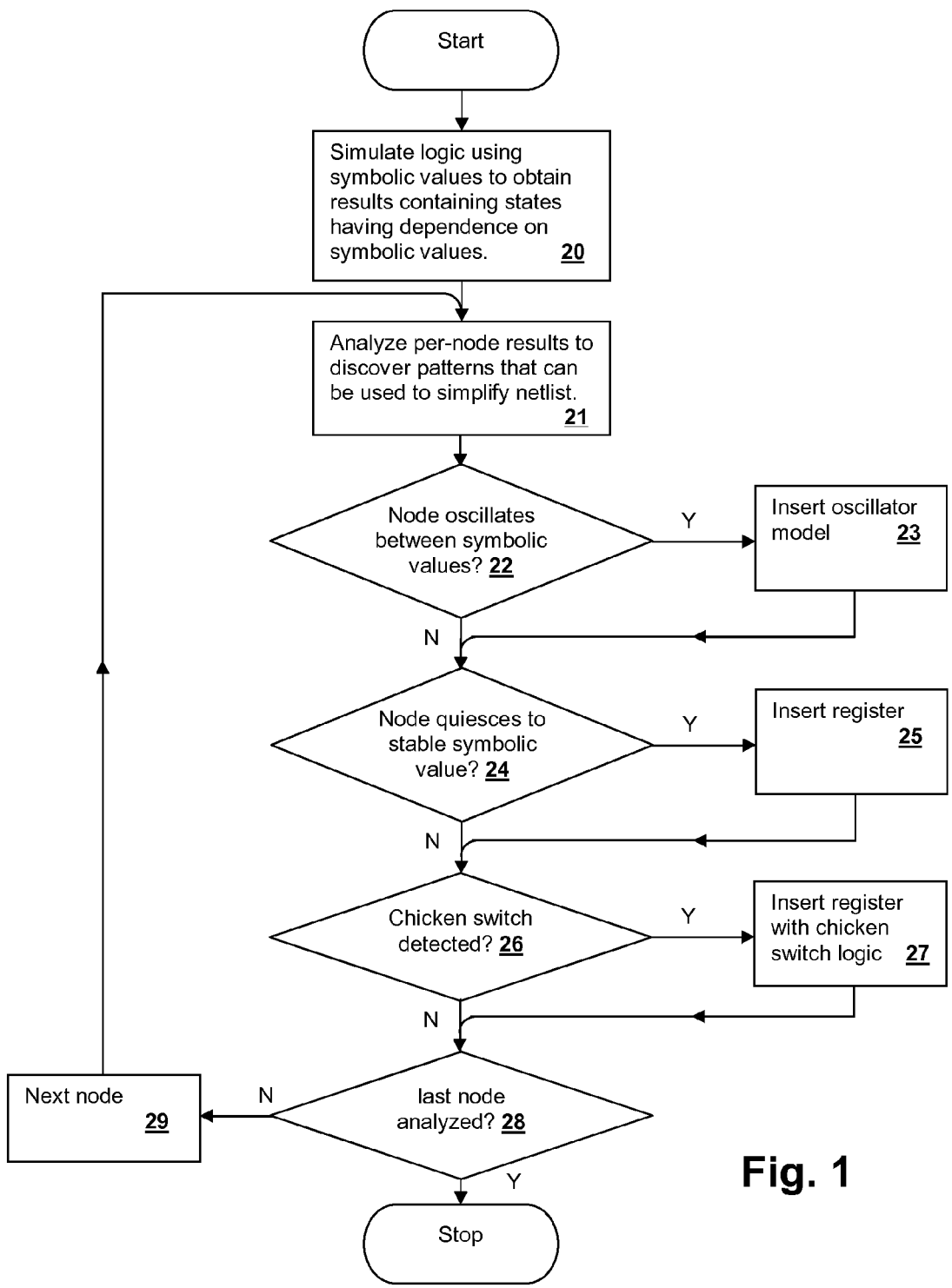
FIG. 1 is a is a flow chart depicting a method in accordance with an embodiment of the present invention.

Referring now to FIG. 1, a method for simulating a logic design and modifying the logic design netlist in accordance with an embodiment of the present invention is shown. First, the logic design is simulated using symbolic values to obtain results containing states having dependence on the symbolic input values (step 20). As mentioned above, step 20 can be performed using the techniques disclosed and claimed in the above-incorporated co-pending U.S. Patent Application, by a symbolic STE analysis that passes the symbolic values through to the STE analysis output, or by another simulation that can generate a set of logic states describing or approximating a logic design behavior with at least initial input values specified by symbols, in which the output of the simulation contains the symbols that specify the initial input values. Next, the simulation results are analyzed to discover patterns that can be used to simplify the netlist, and thus the logic design, providing a simpler logic design that provides the desired behavior, i.e., the behavior being verified or otherwise modeled by the simulation (step 21). The types of netlist reduction that can be performed using the results include:

1) Observations that a node always assumes a constant value for all simulated states. These nodes can be replaced with the constant value rather than the previously-connected logic.
2) Observations that a node has the same value as another node for all simulated states. The nodes can be merged, eliminating redundant or do-nothing logic.

Other types of simplification/netlist reduction are performed according to specific techniques that have been developed for identifying particular circuit behaviors and simplifying the logic netlist to take advantage of the identified behaviors. In the flow chart, if a node is observed to be oscillating between two symbolic values, which includes oscillations between symbolic values or a symbolic value and a constant value (decision 22), then an oscillator model can be inserted in the netlist to replace the logic that was providing the node's state (step 23). Existing phase abstraction techniques can detect oscillators, but not oscillators that are dependent on other logic or the value of an input provided to the logic. Also, if a node quiesces to a stable symbolic value, including stable symbolic values, after an initial portion of circuit operation (decision 24), then a register representing the ultimate stable value can be inserted to represent the node (step 25). If the stable value is a constant, then the register is not needed and the stable value is replaced by the constant value, as in existing temporal decomposition techniques, which cannot detect transient signals that quiesce to stable values other than constants. The present invention also provides for chicken switch detection, which is not possible using the results of ordinary reachability techniques such as ternary simulation. Chicken switches are special configuration bits that are provided to the logic network at power-on. The values of the configuration bits are captured as the initial states of dedicated registers that hold the values of the configuration bits permanently while power is applied to the logic. Chicken switches can be difficult to detect in simulation due to complex logic surrounding the capture-and-hold register. However, using the techniques of the present invention, the dependence of values that are set by chicken switches on initial values of the logical circuit inputs can be detected (decision 26) and a register having the appropriate logic for deriving the chicken switch value inserted in the netlist (step 27). Until the last node of the netlist is analyzed (decision 28), the netlist processing of steps 21-28 is repeated for the next node (step 29).

Figure 2:
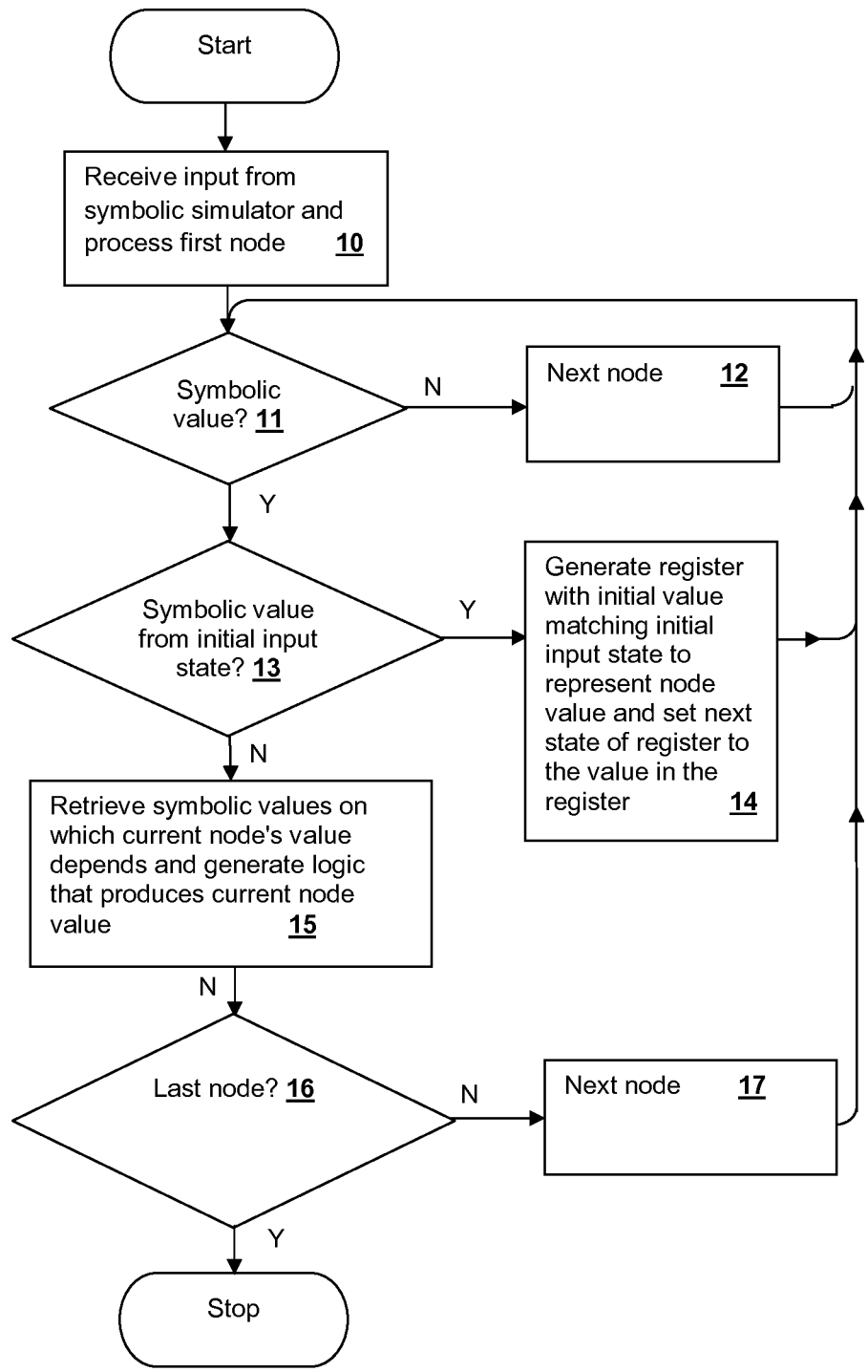
FIG. 2 is a flow chart depicting a method in accordance with another embodiment of the present invention.

Referring now to FIG. 2, details of a computer-performed method in accordance with another embodiment of the invention are shown. The depicted method receives the input from the symbolic simulator and processes the first node (step 10) to introduce registers that represent the symbolic values, according to the following steps. If the node's value does not contain a symbolic value (decision 11), then processing according to the method of FIG. 2 proceeds to the next node (step 12), although other processing may be performed such as detecting constant values for logic simplification can be performed. If the symbolic value detected in decision 11 is a symbolic value that specified an initial input state of one or more inputs to the logic design (decision 13), then a register is generated with an initial value matching the initial input state to represent the node value. The next state of the register is set to the value in the register, so that a value-latching register is provided and inserted in the netlist in place of the logic that previously supplied the node's symbolic value (step 14). If the symbolic value is a symbolic value that was introduced later in simulation, i.e., not a symbolic value that specified an initial state of an input (decision 13), then the method retrieves the symbolic values on which the current node's value depends and generates logic that produces the current node value from those values (step 15). Until the last node is processed (decision 16), the method proceeds to the next node (step 17), and steps 11-17 are repeated. The algorithm illustrated in FIG. 2 can also be exemplified by the following psuedo-code:

```
foreach node containing symbolic value
{
    if ( symbolic value represent input I's time-zero valuation)
    {
        R := create new register with initial value I
        set next_state(R) := R
        return R
    }
    else // symbol is a conjunction of two other symbols
    {
        symbol_1 := get_first_constituent( symbolic value);
        symbol_2 := get_second_constituent( symbolic value);
        return create_and_gate(synthesize_register(symbol_1),
                               synthesize_register(symbol_2) )
    }
}
```

The algorithm illustrated in FIG. 2 detects node values containing symbolic values and if the values are the original symbolic values that represent the time-zero input values to the logic design provided in the simulation, then registers are generated in the logic design netlist to represent those symbolic values. Otherwise, the symbolic values arose from conjunctions of the input symbolic values during subsequent simulation, and the method inserts AND gates to combine the existing symbolic values. The cost of introducing registers can be high. Therefore, it is desirable to minimize the insertion of register. There are many ways to minimize the registers, including exploring relationships between register values, or by shifting the location of the registers within a logic tree that combines different symbolic values.

Referring now to FIG. 3, a method for synthesizing registers according to an embodiment of the invention is shown. The depicted method receives the input from the symbolic simulator and processes the first node (step 30) to introduce registers that represent the symbolic values, according to the following steps. If the node's value does not depend on a symbolic value (decision 31), then processing according to the method of FIG. 3 proceeds to the next node (step 39) unless the current node is the last node (decision 38), although other processing may be performed such as detecting constant values for logic simplification can be performed. If the symbolic value detected in decision 31 is a symbolic value that specified an initial input state of one or more inputs to the logic design (decision 32), then a register is generated with an initial value matching the initial input state to represent the node value, as in the method of FIG. 2. The next state of the register is set to the value in the register, so that a value-latching register is provided and inserted in the netlist in place of the logic that previously supplied the node's symbolic value (step 33). If the symbolic value is a symbolic value that was introduced later in simulation, i.e., not a symbolic value that specified an initial state of an input (decision 32), then the symbolic values on which the current node's value depends are retrieved (step 34). The number of additional registers needed to hold the symbolic values on which the current node's value depends is estimate and if the number is greater than one, the method generates any new registers needed to hold the symbolic values and logic that produces the current node value from the register values is synthesized and inserted in the netlist to replace the current node logic (step 36). If the number of additional registers needed is greater than one (decision 35), then instead new AND logic is generated to combine the time-zero values of the constituent symbolic values and a register is introduced to hold the output of the new AND logic (step 37) to replace the current node logic. Until the last node is processed (decision 38), the method proceeds to the next node (step 39), and steps 31-39 are repeated. The algorithm illustrated in FIG. 3 can also be exemplified by the following psuedo-code:

values. If the symbolic value is a conjunction of two or more symbolic values, then there are two possible paths: the representation of the multiple input values can be latched and combined with an AND gate, or the time-zero value of the conjunction can be formed with AND logic and then latched to provide the symbolic value. The algorithm selects the approach that will result in the fewest number of registers introduced for each symbolic value being synthesized, resulting in introducing the least number of new registers when processing the simulation results.

Figure 4A:
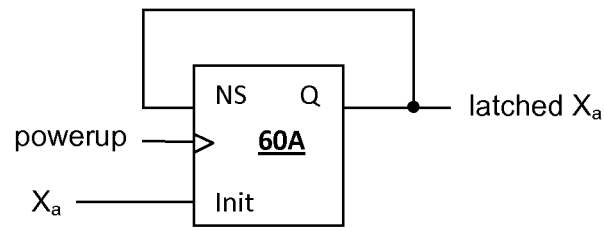
FIGS. 4A-4C are circuits illustrating simplifications applied to a logic design by techniques according to embodiments of the present invention
Figure 4B:
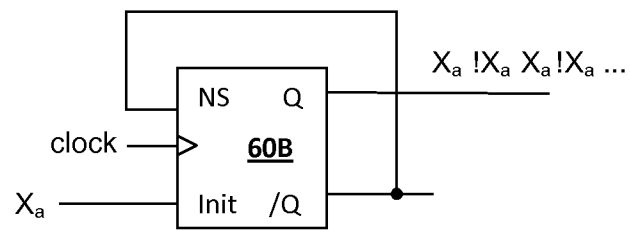
Figure 4C:
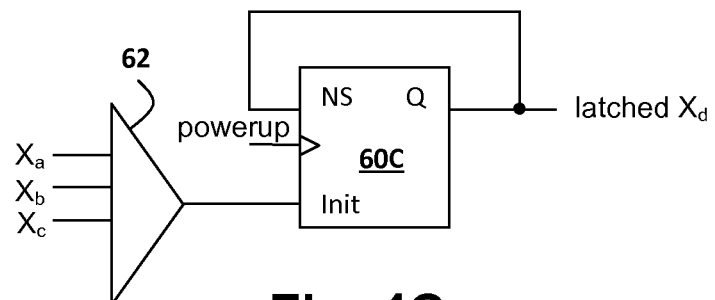

Referring now to FIGS. 4A-4C, circuit blocks that can be inserted in a logic design to simplify or reduce a netlist according to an embodiment of the invention, are shown. FIG. 4A illustrates a latching register 60A configuration having an initial state set by symbolic value $X_a$, which in this case may be a real input time-zero value. Output latched $X_a$ then provides this value for all time in the netlist, when used to replace a node's logic. The circuit of FIG. 4A is representative of a circuit that can be used to replace a node having a value determined by a time-zero input value or a transient node that settles to a symbolic value after an initialization period. The

```
function SynthesizeRegister( symbolic value)
{
    if( symbolic value represents an input I's time-zero valuation)
    {
        R := create new register with initial value I
        set next_state(R) := R
        return R
    }
    else //symbolic value is a conjunction of two other symbols
    {
        symbol_1 = get_first_constituent( symbolic value);
        symbol_2 = get_second_constituent( symbolic value);
        num_regs = estimate number of registers that will be introduce
                by synthesizing registers for symbol_1 and symbol_2
        if( num_regs <= 1)
        {
            return create_and_gate( SynthesizeRegister( symbol_1),
                                    SynthesizeRegister( symbol_2) )
        }
        else
        {
            unlatched := create_and_gate( synthesizeTime0Logic(symbol_1),
                                        synthesizeTime0Logic(symbol_2))
            R := create new register with initial value of unlatched
            set next_state(R) := R
            return R
        }
    }
}
function synthesizeTime0Logic(symbol)
{
    if( symbolic value represents an input I's time-zero valuation)
    {
        return I
    }
    else
    {
        symbol_1 := get_first_constituent( symbolic value);
        symbol_2 := get_second_constituent( symbolic value);
        // recurse until symbol is reduced to base constituents
        return synthesizeTime0Logic( symbol_1, symbol_2)
    }
}
```

Function SynthesizeRegister( ) attempts to minimize the number of registers introduced, in contrast to the algorithm of FIG. 2. Function synthesizeTime0Logic( ) operates on a symbol and returns logic that represents the symbol at time-zero only. The logic returned by synthesizeTime0Logic( ) contains no registers. SynthesizeRegister( ) receives the output of synthesizeTime0Logic( ) and inserts registers that hold those circuit depicted in FIG. 4B illustrates a simple oscillator circuit that can be used to replace node logic that exhibits a behavior $X_a \, !X_a \, X_a \, !X_a \ldots$ that alternates between a single symbolic value $X_a$ and its complement $!X_a$ at each state cycle. A register 60B has an initial value set by symbolic value $X_a$ and has a next state dependent on the complement of its own state. Other more complicated oscillator circuits can be used to provide mode complex oscillator behavior when needed, but the depicted oscillator circuit is an example of an oscillator replacement that can be used to simplify a netlist containing a node that oscillates between at least one value dependent on a symbolic value. FIG. 4C illustrates a circuit that can be used to simplify a netlist that includes chicken switches. A logic block 62 synthesizes the chicken switch value that is retained in the node after initialization. A register 60C latches the output of logic block 62 at initialization time and holds the value, replacing otherwise complex chicken switch logic.

Figure 5:
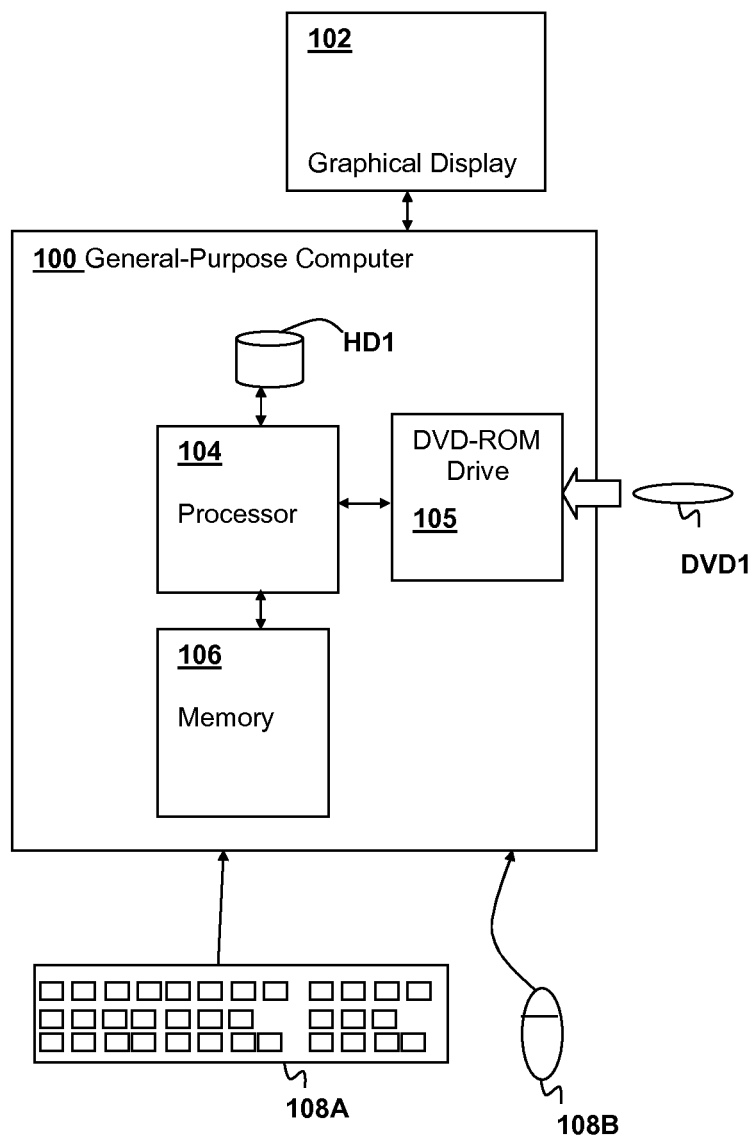
FIG. 5 is a block diagram illustrating a computer system in which program code according to an embodiment of the present invention implementing a method according to an embodiment of the invention is executed.

Referring now to FIG. 4, a computer system in which the above-described computer-performed methods are performed, is shown. A general-purpose computer 100 is coupled to a graphical display 102 for display of simulation and netlist modification results, as well as user interface screens for controlling one or more programs including programs forming computer program products including program instructions for carrying out the methods described above. Input devices such as a keyboard 108A and a mouse 108B provide for user interaction with general-purpose computer 100. General-purpose computer 100 includes a processor 104 for executing program instructions stored in a memory 106 including program instructions forming the above-described computer program products in accordance with embodiments of the invention. A removable storage device, such as a DVD-ROM drive 105 is included for accepting storage media such as DVD-ROM DVD1 forming a computer program product in accordance with an embodiment of the invention. The computer system depicted in FIG. 5 is only one example of a computer system such as a desktop computer system or a notebook computer system that can be used to perform the simulations and netlist modification described above. Other types of computer systems, including distributed and networked computer systems in which some or all of the algorithms and portions thereof are executed remotely are within the scope of the invention as contemplated herein, and the system depicted in FIG. 5 should not be construed as limiting the type of computer system or computer program products that form embodiments of the present invention.

As noted above, portions of the present invention may be embodied in a computer program product, which may include firmware, an image in system memory or another memory/cache, or stored on a fixed or re-writable media such as an optical disc having computer-readable code stored thereon. Any combination of one or more computer readable medium(s) may store a program in accordance with an embodiment of the invention. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of the present application, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A computer-performed method performed by a general-purpose computer system that modifies a netlist describing a logic design, the method comprising:

reading, by a computer system, a simulation output from a simulation performed on the logic design, wherein the simulation output contains states having values dependent on symbolic values introduced as inputs to the logic design in the simulation and specified by including the symbolic values in the simulation output;

determining, within the computer system, that the symbolic values reveal relationships or behaviors within the logic design that indicate that the logic design can be simplified or reduced; and modifying responsive to the determining and by the computer system, the netlist to simplify or reduce the netlist in accordance with a result of the determining.

2. The computer-performed method of claim 1, wherein the determining determines that multiple nodes of the logic design assume values in the simulation output that resolve to the same symbolic value, and wherein the modifying merges the multiple nodes to reduce the netlist.

3. The computer-performed method of claim 1, wherein the determining determines that a node of the logic design oscillates between one of the symbolic values and another symbolic value or constant value in the simulation output, and wherein the modifying constructs an equivalent oscillator circuit to simplify the netlist.

4. The computer-performed method of claim 1, wherein the determining determines that a node of the logic design has a node value in the simulation output that is dependent on a circuit that sets the node value at an initialization time from one or more particular inputs of the logic design by observing the dependence of the node value on one or more of the symbolic values corresponding to the one or more particular inputs, and wherein the modifying constructs a register circuit having logic for setting and holding the value in the register from the one or more particular inputs at initialization time and replaces logic that provides the node value with the register.

5. The computer-performed method of claim 1, wherein the determining determines that a node of the logic design has a transient node value that changes during an initial period of the simulation output, but then assumes a constant node value dependent on one or more of the symbolic values, and wherein the modifying constructs a register circuit having logic for setting and holding the constant node value in the register and replaces logic that provides the node value with the register.

6. The computer-performed method of claim 1, wherein the determining determines that a node of the logic design has a node value equal to a logical-AND of two or more of the symbolic values, and wherein the modifying constructs multiple registers for holding the two or more symbolic values and replaces logic that provides the node value with a logical AND gate having inputs connected to outputs of the multiple registers.

7. The computer-performed method of claim 1, wherein the determining determines that a node of the logic design has a node value equal to a logical-AND of two or more of the symbolic values, and wherein the modifying comprises:
   determining a number of new registers required to hold the two or more symbolic values;
   responsive to determining that the number of new registers is less than or equal to one, constructing multiple registers for holding the two or more symbolic values and replacing logic that provides the node value with a logical AND gate having inputs connected to outputs of the multiple registers; and
   responsive to determining that the number of new registers is greater than one, constructing a single register for holding a logical AND of the two or more symbolic values and providing an input to the single register from a new logical AND gate having inputs connected to the inputs to the logic design corresponding to the two or more symbolic values and an output coupled to the input to the single register.

8. A computer system comprising a processor for executing program instructions coupled to a memory for storing the program instructions, wherein the program instructions are program instructions for modifying a netlist describing a logic design, wherein the program instructions comprise program instructions for:
   reading a simulation output from a simulation performed on the logic design, wherein the simulation output contains states having values dependent on symbolic values introduced as inputs to the logic design in the simulation and specified by including the symbolic values in the simulation output;
   determining that the symbolic values reveal relationships or behaviors within the logic design that indicate that the logic design can be simplified or reduced; and
   modifying the netlist to simplify or reduce the netlist in accordance with a result of the determining.

9. The computer system of claim 8, wherein the program instructions for determining determine that multiple nodes of the logic design assume values in the simulation output that resolve to the same symbolic value, and wherein the program instructions for modifying merge the multiple nodes to reduce the netlist.

10. The computer system of claim 8, wherein the program instructions for determining determine that a node of the logic design oscillates between one of the symbolic values and another symbolic value or constant value in the simulation output, and wherein the program instructions for modifying construct an equivalent oscillator circuit to simplify the netlist.

11. The computer system of claim 8, wherein the program instructions for determining determine that a node of the logic design has a node value in the simulation output that is dependent on a circuit that sets the node value at an initialization time from one or more particular inputs of the logic design by observing the dependence of the node value on one or more of the symbolic values corresponding to the one or more particular inputs, and wherein the program instructions for modifying construct a register circuit having logic for setting and holding the value in the register from the one or more particular inputs at initialization time and replaces logic that provides the node value with the register.

12. The computer system of claim 8, wherein the program instructions for determining determine that a node of the logic design has a transient node value that changes during an initial period of the simulation output, but then assumes a constant node value dependent on one or more of the symbolic values, and wherein the program instructions for modifying construct a register circuit having logic for setting and holding the constant node value in the register and replaces logic that provides the node value with the register.

13. The computer system of claim 8, wherein the program instructions for determining determine that a node of the logic design has a node value equal to a logical-AND of two or more of the symbolic values, and wherein the program instructions for modifying construct multiple registers for holding the two or more symbolic values and replaces logic that provides the node value with a logical AND gate having inputs connected to outputs of the multiple registers.

14. The computer system of claim 8, wherein the program instructions for determining determine that a node of the logic design has a node value equal to a logical-AND of two or more of the symbolic values, and wherein the program instructions for modifying determines a number of new registers required to hold the two or more symbolic values, and wherein the program instructions for modifying comprises program instructions for:
   determining a number of new registers required to hold the two or more symbolic values;
   responsive to determining that the number of new registers is less than or equal to one, constructing multiple registers for holding the two or more symbolic values and replacing logic that provides the node value with a logical AND gate having inputs connected to outputs of the multiple registers; and
   responsive to determining that the number of new registers is greater than one, constructing a single register for holding a logical AND of the two or more symbolic values and providing an input to the single register from a new logical AND gate having inputs connected to the inputs to the logic design corresponding to the two or more symbolic values and an output coupled to the input to the single register.

15. A computer program product comprising a computer-readable storage device storing program instructions for execution by a general-purpose computer system, wherein the program instructions are program instructions for modifying a netlist describing a logic design, wherein the program instructions comprise program instructions for:
   reading a simulation output from a simulation performed on the logic design, wherein the simulation output contains states having values dependent on symbolic values introduced as inputs to the logic design in the simulation and specified by including the symbolic values in the simulation output;
   determining that the symbolic values reveal relationships or behaviors within the logic design that indicate that the logic design can be simplified or reduced; and
   modifying the netlist to simplify or reduce the netlist in accordance with a result of the determining.

16. The computer program product of claim 15, wherein the program instructions for determining determine that multiple nodes of the logic design assume values in the simulation output that resolve to the same symbolic value, and wherein the program instructions for modifying merge the multiple nodes to reduce the netlist.

17. The computer program product of claim 15, wherein the program instructions for determining determine that a node of the logic design oscillates between one of the symbolic values and another symbolic value or constant value in the simulation output, and wherein the program instructions for modifying construct an equivalent oscillator circuit to simplify the netlist.

18. The computer program product of claim 15, wherein the program instructions for determining determine that a node of the logic design has a node value in the simulation output that is dependent on a circuit that sets the node value at an initialization time from one or more particular inputs of the logic design by observing the dependence of the node value on one or more of the symbolic values corresponding to the one or more particular inputs, and wherein the program instructions for modifying construct a register circuit having logic for setting and holding the value in the register from the one or more particular inputs at initialization time and replaces logic that provides the node value with the register.

19. The computer program product of claim 15, wherein the program instructions for determining determine that a node of the logic design has a transient node value that changes during an initial period of the simulation output, but then assumes a constant node value dependent on one or more of the symbolic values, and wherein the program instructions for modifying construct a register circuit having logic for setting and holding the constant node value in the register and replaces logic that provides the node value with the register.

20. The computer program product of claim 15, wherein the program instructions for determining determine that a node of the logic design has a node value equal to a logical-AND of two or more of the symbolic values, and wherein the program instructions for modifying construct multiple registers for holding the two or more symbolic values and replaces logic that provides the node value with a logical AND gate having inputs connected to outputs of the multiple registers.

21. The computer program product of claim 15, wherein the program instructions for determining determine that a node of the logic design has a node value equal to a logical-AND of two or more of the symbolic values, and wherein the program instructions for modifying determines a number of new registers required to hold the two or more symbolic values, and wherein the program instructions for modifying comprises program instructions for:
- determining a number of new registers required to hold the two or more symbolic values;
- responsive to determining that the number of new registers is less than or equal to one, constructing multiple registers for holding the two or more symbolic values and replacing logic that provides the node value with a logical AND gate having inputs connected to outputs of the multiple registers; and
- responsive to determining that the number of new registers is greater than one, constructing a single register for holding a logical AND of the two or more symbolic values and providing an input to the single register from a new logical AND gate having inputs connected to the inputs to the logic design corresponding to the two or more symbolic values and an output coupled to the input to the single register.

\* \* \* \* \*